(12) United States Patent
Ohkoshi et al.

(10) Patent No.: US 10,669,161 B2
(45) Date of Patent: Jun. 2, 2020

(54) ORIENTED BODY CONTAINING E-IRON OXIDE, METHOD FOR PRODUCING THE SAME, AND DEVICE FOR PRODUCING THE SAME

(71) Applicants: THE UNIVERSITY OF TOKYO, Tokyo (JP); DOWA ELECTRONICS MATERIALS CO., LTD., Tokyo (JP)

(72) Inventors: Shin-ichi Ohkoshi, Tokyo (JP); Hiroko Tokoro, Tokyo (JP); Koji Nakabayashi, Tokyo (JP); Asuka Namai, Tokyo (JP); Kenta Imoto, Tokyo (JP); Kenji Masada, Tokyo (JP)

(73) Assignees: THE UNIVERSITY OF TOKYO, Tokyo (JP); DOWA ELECTRONICS MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/544,147

(22) PCT Filed: Jan. 18, 2016

(86) PCT No.: PCT/JP2016/051304
§ 371 (c)(1),
(2) Date: Jul. 17, 2017

(87) PCT Pub. No.: WO2016/117511
PCT Pub. Date: Jul. 28, 2016

(65) Prior Publication Data
US 2017/0349448 A1    Dec. 7, 2017

(30) Foreign Application Priority Data

Jan. 19, 2015  (JP) .................................. 2015-008160
Jan. 15, 2016  (JP) .................................. 2016-006230

(51) Int. Cl.
| | | |
|---|---|---|
| *C01G 49/06* | (2006.01) | |
| *C01G 49/02* | (2006.01) | |
| *H01F 1/113* | (2006.01) | |
| *G11B 5/845* | (2006.01) | |
| *H01F 41/16* | (2006.01) | |
| *G11B 5/706* | (2006.01) | |
| *H05K 9/00* | (2006.01) | |
| *H01F 1/11* | (2006.01) | |

(52) U.S. Cl.
CPC ............. *C01G 49/02* (2013.01); *C01G 49/06* (2013.01); *G11B 5/706* (2013.01); *G11B 5/70642* (2013.01); *G11B 5/845* (2013.01); *H01F 1/113* (2013.01); *H01F 41/16* (2013.01); *H05K 9/00* (2013.01); *H01F 1/11* (2013.01)

(58) Field of Classification Search
CPC ...................................................... C01G 49/06
See application file for complete search history.

(56) References Cited

U.S. PATENT DOCUMENTS

| 4,916,021 A | 4/1990 | Karle et al. |
|---|---|---|
| 2009/0261919 A1* | 10/2009 | Takeda .................... H01F 1/113 333/1.1 |
| 2010/0238063 A1 | 9/2010 | Ohkoshi et al. |
| 2012/0100064 A1 | 4/2012 | Ohkoshi et al. |

FOREIGN PATENT DOCUMENTS

| JP | 57-162125 | 10/1982 |
|---|---|---|
| JP | 2008-63199 | 3/2008 |
| JP | 2008-174405 | 7/2008 |
| JP | 5124825 | 1/2013 |
| WO | 2008/029861 | 3/2008 |
| WO | 2010/150853 | 12/2010 |

OTHER PUBLICATIONS

Sakurai, "Preparation of magnetically oriented epsilon-Fe2O3 nanoparticles exhibiting large coercive field" 30th meeting of the Magnetics Society of Japan, 13pD-3 (Year: 2006).*
Translation of Sakurai, "Preparation of magnetically oriented epsilon-Fe2O3 nanoparticles exhibiting large coercive field" 30th meeting of the Magnetics Society of Japan, 13pD-3 (Year: 2006).*
Sakurai et al, "Large coercive field and spin reorientation phenomenon in epsilon-Fe2O3 nanorod" 29th meeting of the Magnetics Society of Japan, 21pPS-17. (Year: 2005).*
Translation of Sakurai et al, "Large coercive field and spin reorientation phenomenon in epsilon-Fe2O3 nanorod" 29th meeting of the Magnetics Society of Japan, 21pPS-17. (Year: 2005).*
International Search Report, along with English-language translation thereof, issued in PCT/JP2016/051304 dated Mar. 22, 2016.
Written Opinion of the International Searching Authority, along with English-language translation thereof, issued in PCT/JP2016/051304 dated Mar. 22, 2016.

* cited by examiner

Primary Examiner — Steven J Bos
(74) Attorney, Agent, or Firm — Greenblum & Bernstein, P.L.C.

(57) ABSTRACT

There are provided an oriented body such as a magnetic sheet in which a value of degree of orientation of magnetic particles is beyond 3.5, and a method for producing the same, and a device for producing the same, wherein the oriented body such as a magnetic sheet is produced through the steps of: mixing a mixed solution containing a solvent and a vehicle and ε-iron oxide particles by shaking stirring, and dispersing the ε-iron oxide particles in the mixed solution; providing a mixed solution in which the ε-iron oxide particles are dispersed, on a predetermined substrate; and removing the solvent while applying a magnetic field to the substrate provided with the mixed solution, to obtain an oriented body.

2 Claims, 8 Drawing Sheets

ORIENTED BODY CONTAINING E-IRON OXIDE, METHOD FOR PRODUCING THE SAME, AND DEVICE FOR PRODUCING THE SAME

TECHNICAL FIELD

The present invention relates to an oriented body containing ε-iron oxide, a method for producing the same, and a device for producing the same.

DESCRIPTION OF RELATED ART

ε-iron oxide is an extremely rare phase among iron oxides. Then, an existence of ε-iron oxide showing a huge coercive force (Hc) of 20 kOe ($1.59 \times 10^6$ A/m) at room temperature with a particle size of nano order, has been confirmed. There are α-iron oxide and γ-iron oxide as most universal ones of polymorphs having different composition while having the composition of iron oxide, and εiron oxide is one of them.

This ε-iron oxide shows a huge Hc, and therefore is expected to be applied to high density magnetic recording media or other magnetic applications or electromagnetic wave absorbing applications.

On the other hand, in a magnetic material including a magnetic recording medium constructed by a magnetic particle filling structure, an alignment treatment is sometimes applied in a production process so that magnetization easy-axes of the magnetic particles are aligned in one direction, generally for the purpose of particularly remarkably improving magnetic properties in a magnetic field in a specific direction.

Then, as a typical orientation treatment, magnetic field orientation can be mentioned. This is a treatment of kneading magnetic powder particles together with a binder such as a resin, to form a filling structure of a predetermined shape, and applying a unidirectional magnetic field to the filling structure while the binder still has fluidity, so that the magnetization easy-axes of particles are aligned to a direction of the applied magnetic field. When the binder is cured after this orientation treatment is finished, the particles constituting the filling structure are fixed in a state in which the magnetization easy-axes are aligned in a certain direction.

Then, inventors of the present invention disclose a magnetic material in patent document 1, in which a coercive force (Hc) exceeding 20 kOe ($1.59 \times 10^6$ A/m) is observed in a magnetic hysteresis loop measured by applying a magnetic field parallel to the orientation direction of the magnetization easy-axes.

PRIOR ART DOCUMENT

Patent Document

Patent document 1: Patent Publication No.5124825

SUMMARY OF THE INVENTION

Problem to be solved by the Invention

It is desired that the magnetic particles are oriented in one direction in a magnetic sheet which is a magnetic material used for a high recording density medium or a high efficiency electromagnetic wave absorber. However, it is generally difficult to increase a degree of orientation of the magnetic particles in the magnetic material.

For example, when the degree of orientation of the magnetic particles is defined by a value of the squareness ratio (SQ) as shown in formula (1), the magnetic particles having the degree of orientation beyond 3.5 are not obtained.

Degree of orientation=SQ (direction of magnetization easy-axis)/SQ (direction of magnetization hard-axis)     Formula (1)

On the other hand, when the value of the degree of orientation of the magnetic particles in the oriented body such as a magnetic sheet, is increased beyond 3.5, it is conceivable that a magnetic behavior becomes sharp. As a result, even in the oriented body such as the magnetic sheet, improvement of magnetic recording density and improvement of Faraday effect efficiency can be expected at a level close to single crystal of the magnetic material.

The present invention is provided under the abovementioned circumstance, and an objective of the present invention is to provide an oriented body such as a magnetic sheet in which the degree of orientation of the magnetic particles described above is beyond 3.5, and a method for producing the same, and a device for producing the same.

Means for solving the Problem

In order to solve the abovementioned problem, the inventors of the present invention carry out intensive studies, and it is found that (1) Magnetic particles: it is preferable to use ε-iron oxide particles having high coercive force (Hc) as magnetic particles, (2) Method of aligning magnetic particles: when magnetic particles in a medium are oriented, by performing it under a magnetic flux density of a strong magnetic field of 2 Tesla or more from a viewpoint of enhancing a certainty of orientation, the degree of orientation of the obtained magnetic sheet or the like can be raised beyond 3.5.

When the magnetic sheet or the like of the present invention is produced according to the abovementioned configurations of (1) and (2), conventionally, magnetic powders are dispersed using a device such as a planetary ball mill or an ultrasonic dispersing machine with high dispersing ability. However, according to the present invention, it is also found that even with a simple shaking type dispersion stirring device, it is possible to produce a magnetic dispersed body with high magnetic responsiveness.

Namely, in order to solve the abovementioned problem, a first invention is an oriented body containing ε iron oxide particles as magnetic particles, wherein the degree of orientation of magnetic particles defined by "degree of orientation=SQ (direction of magnetization easy-axes)/SQ (direction of magnetization hard-axes)", is beyond 3.5.

A second invention is a method for producing an oriented body containing ε iron oxide, including:

mixing a mixed solution containing a solvent and a vehicle and ε-iron oxide particles by shaking stirring, and dispersing the ε-iron oxide particles in the mixed solution;

providing a mixed solution in which the ε-iron oxide particles are dispersed, on a predetermined substrate; and removing the solvent while applying a magnetic field to the substrate provided with the mixed solution, to obtain an oriented body.

A third invention is the method for producing an oriented body according to the second invention, wherein a value of a magnetic flux density of the magnetic field is 2 Tesla or more.

A fourth invention is a production device for performing the second or third invention, having:

a dispersing function of mixing a mixed solution containing a solvent and a vehicle and ε-iron oxide particles by shaking stirring, and dispersing the ε-iron oxide particles in the mixed solution;

a coating function of providing a mixed solution in which the ε-iron oxide particles are dispersed, on a predetermined substrate; and a magnetic field application function of removing the solvent while applying a magnetic field to the mixed solution in which the ε-iron oxide particles are dispersed.

Advantage of the Invention

According to the present invention, it is possible to obtain an oriented body such as a magnetic sheet having an orientation degree value beyond 3.5.

DETAILED DESCRIPTION OF THE INVENTION

Figure 1:
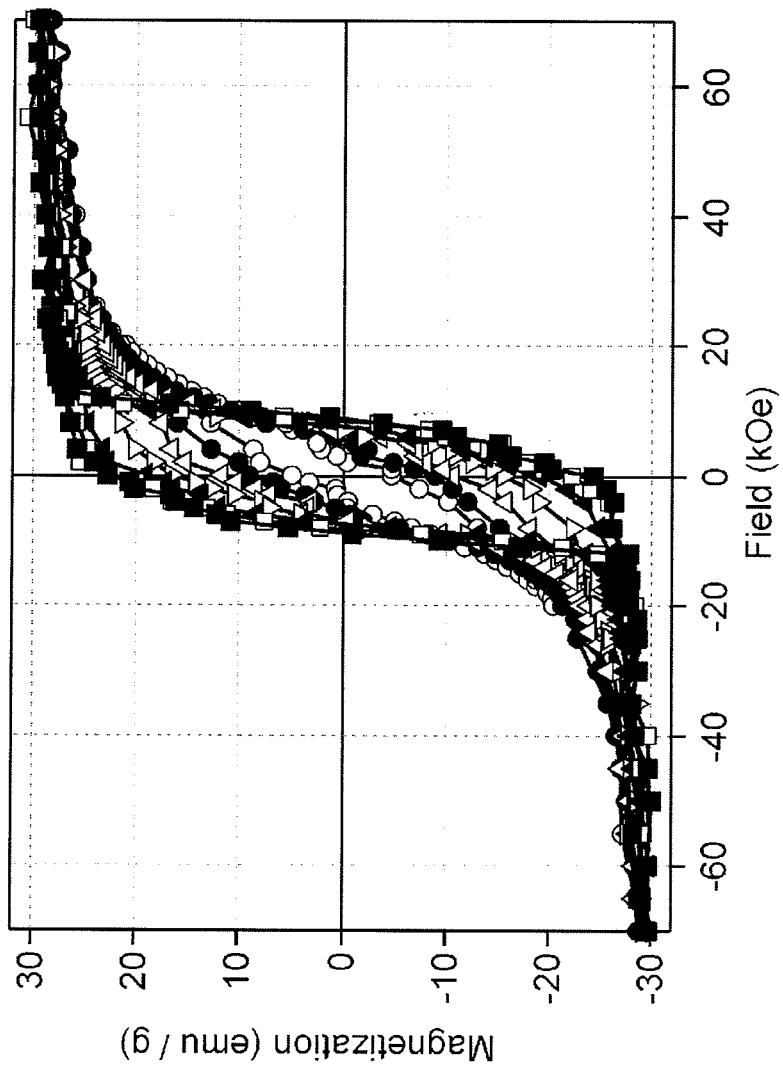
FIG. 1 is a graph showing a magnetization curve at ±70 kOe of an oriented body containing ε-iron oxide according to example 1 of the present invention.

Embodiments of the present invention will be described in an order of (1) Magnetic particles, (2) Method of dispersing magnetic particles, (3) Method of orienting magnetic particles, (4) Vehicle, (5) Magnetic properties of an oriented body containing ε-iron oxide of the present invention, (6) Device for producing an oriented body containing ε-iron oxide according to the present invention.

(1) Magnetic Particles

The magnetic particles used in the present invention are preferably ε-iron oxide particles having a high coercive force (Hc).

Explanation will be given for the method for producing the ε-iron oxide particles in example 1 described later, with a case in which ε-$Fe_2O_3$ crystal particles of Ga substitution type (for example, satisfying x=0.45 when molar ratio of Ga and Fe is expressed by Ga: Fe=x:(2−x)), is synthesized in a water-surfactant system, as an example.

(2) Method of Dispersing Magnetic Particles

Explanation will be given for an operation for obtaining a dispersion liquid by dispersing ε-iron oxide particles in a predetermined solvent using a shaking type stirring device.

ε-iron oxide particles, a predetermined solvent, a vehicle, a mixing ball (for example, zirconia ball of 0.3 mmφ) are charged into a container such as a centrifuge tube. Then, the container is shaken at a shaking number of 100 to 3000 times/min, an amplitude of 1 to 10 mm, and for 0.5 to 10 hours, to thereby obtain a dispersion liquid.

In a conventional technique, in stirring, as disclosed in U.S. Pat. No. 5,124,825 for example, the magnetic particles are dispersed in a predetermined medium by using an ultrasonic type stirring and dispersing device or a large-scale rotating type stirring and dispersing device such as a planetary ball mill.

In contrast, in the present invention, it is found that when ε-iron oxide particles are dispersed as magnetic particles in a predetermined solvent of the present invention, an oriented body with high degree of orientation can be obtained even in a case that the ε-iron oxide particles are dispersed by a simple method and a device using a shaking type stirring device.

(3) Method of Orienting Magnetic Particles

The dispersion liquid of the present invention obtained by dispersing the ε-iron oxide particles in a predetermined solvent is provided on a substrate. For example, a polyester film may be stuck on a glass substrate and the dispersion liquid may be dropped onto the film.

The dispersion liquid of the present invention provided on the obtained substrate is placed under a magnetic flux density of 2 Tesla or more from a viewpoint of enhancing certainty of orientation, and the mixed solvent is volatilized to cure a vehicle, to thereby obtain a magnetic sheet as an oriented body.

(4) Vehicle

In the present invention, a vehicle for curing a dispersion liquid will be described.

The vehicle used in the present invention is preferably one or more kinds selected from urethane resin and vinyl chloride resin, etc., from a viewpoint of increasing and keeping the degree of orientation of the ε-iron oxide particles. Among them, a combination use of urethane resin and vinyl chloride resin is preferable.

A solution prepared by dissolving these resins in one or more kinds of solvents selected from acetylacetone, n-butyl stearate, cyclohexane, toluene, methyl ethyl ketone and the like may be used as the vehicle.

(5) Magnetic Properties of an Oriented Body Containing ε-Iron Oxide

As a result, a magnetic sheet which is an oriented body containing ε-iron oxide and having a value of the degree of orientation beyond 3.5, can be obtained.

Although details will be described in the first embodiment, it is found that the value of degree of orientation of the magnetic particles defined by "degree of orientation=SQ (direction of magnetization easy-axis)/SQ (direction of magnetization hard-axis)" is 4.6, which is greatly beyond 3.5.

Namely, it is conceivable that the magnetic sheet, which is the oriented body containing ε-iron oxide of the present invention, exhibits properties unique to ε-iron oxide, thus showing a sharp magnetic behavior. As a result, even in this oriented body, improvement of magnetic recording density and improvement of Faraday effect efficiency can be expected at a level close to that of a single crystal.

(6) Device for Producing an Oriented Body Containing ε-Iron Oxide According to the Present Invention The magnetic sheet which is the oriented body containing ε-iron oxide of the present invention can also be produced without using a dedicated production device. However, in order to produce the magnetic sheet which is the oriented body containing ε-iron oxide of the present invention with high uniformity and productivity, it is preferable to use the production device of the present invention described later.

The device for producing the magnetic sheet, which is the oriented body containing ε-iron oxide of the present invention, will be described hereafter, with reference to the drawings.

Figure 4:
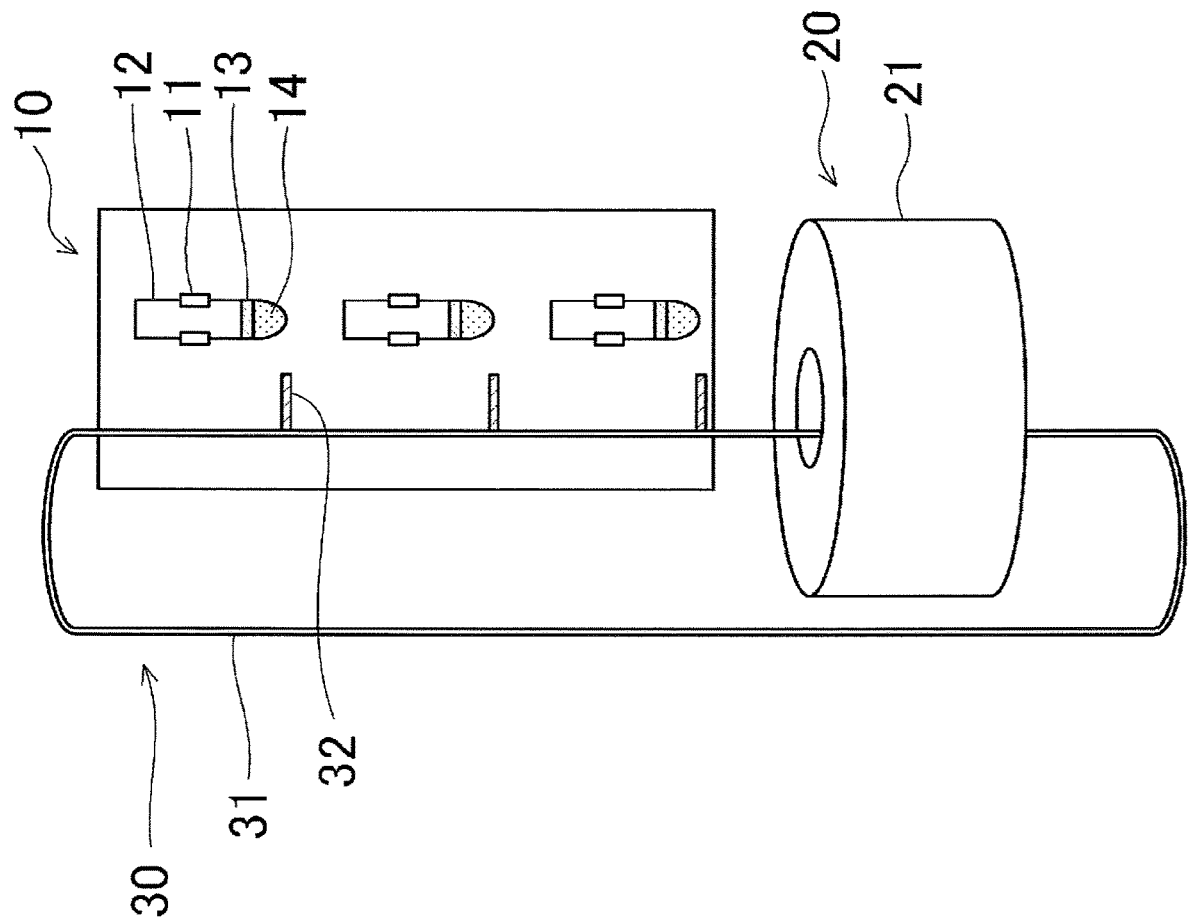
FIG. 4 is a schematic view of an example of a device for producing an oriented body containing ε-iron oxide according to the present invention.

FIGS. 4 to 8 are schematic views of an example of the device for producing the oriented body containing ε-iron oxide according to the present invention, wherein FIG. 4 shows an entire body of the device, and FIGS. 5 to 8 show an operation state of the device.

As shown in FIG. 4, the device includes a shaking part 10, a magnetic field applying part 20, and a conveying part 30.

The shaking part 10 is a part for shaking the container 12 by a shaking device 11. The shaking is, for example, a vertical movement, and the number of shaking is 100 to 3000 times/min, and an amplitude of shaking is 1 to 10 mm. A mixed liquid 13 of the ε-iron oxide particles, the vehicle and a predetermined solvent, and a mixing ball 14 are charged in the container 12.

The mixing ball is preferably a zirconia ball having a diameter of 0.1 mmφ to 2 mmφ.

The magnetic field applying part 20 has an electromagnet 21 for placing a target to which the magnetic field is applied (called a target hereafter), in a magnetic field. A permanent magnet or a superconducting magnet may also be used as the electromagnet 21. Then, the electromagnet 21 can exert a magnetic force to the target, with a magnetic flux density of 2 Tesla or more.

The conveying part 30 includes a conveyor 31 that conveys a substrate 32, which is a conveyance object, to the shaking part 10 and the magnetic field applying part 20.

Figure 5:
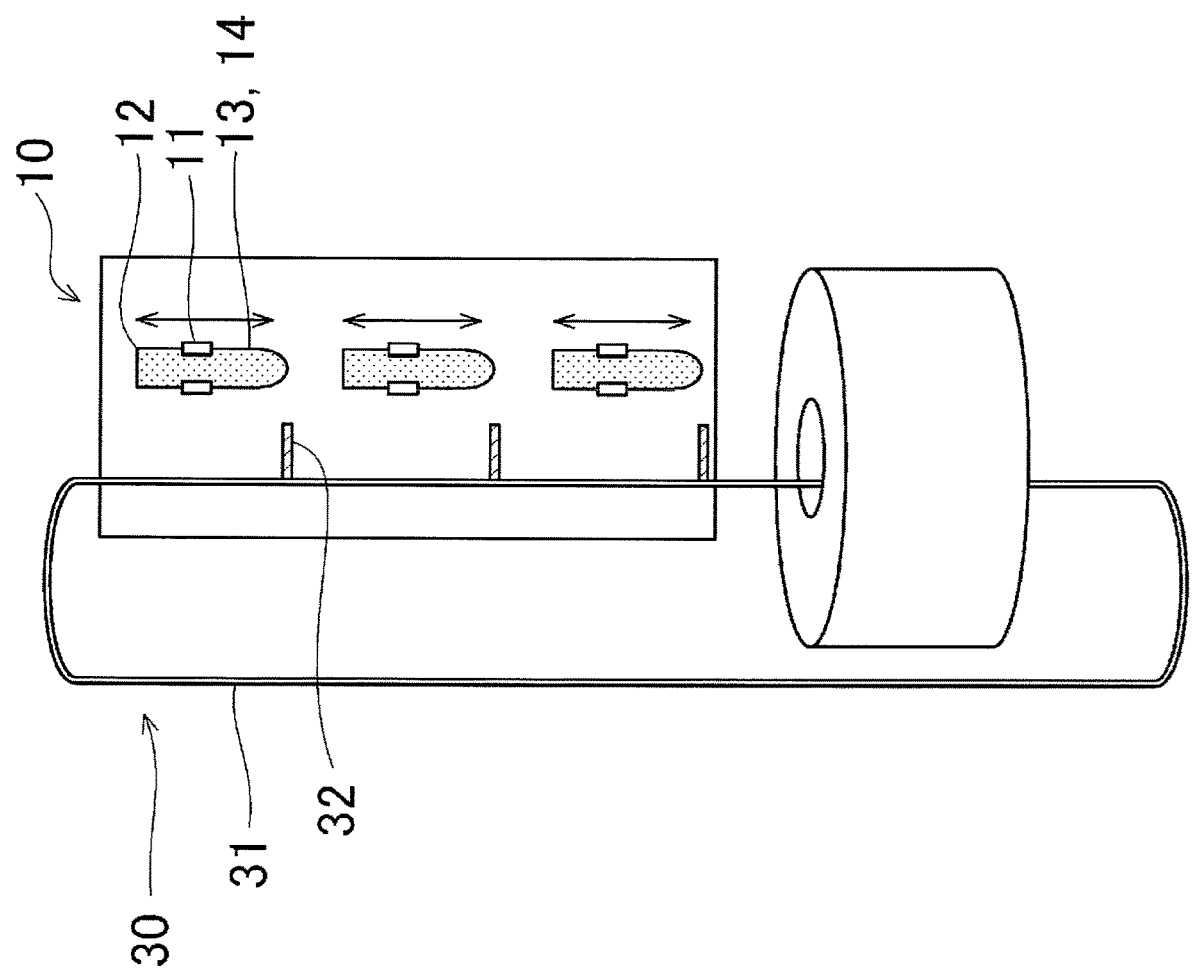
FIG. 5 is a schematic view when a shaking operation is performed by the production device shown in FIG. 4.

First, as shown in FIG. 5, a mixed solution 13 of the ε-iron oxide particle, the vehicle, a predetermined solvent, and a mixing ball 14 are charged in the container 12. Then, the container 12 is set in the shaking device 11 to perform shaking to the container 12, so that the mixed solution 13 and the mixing ball 14 are stirred, to thereby obtain a dispersion liquid of the ε iron oxide particles.

Figure 6:
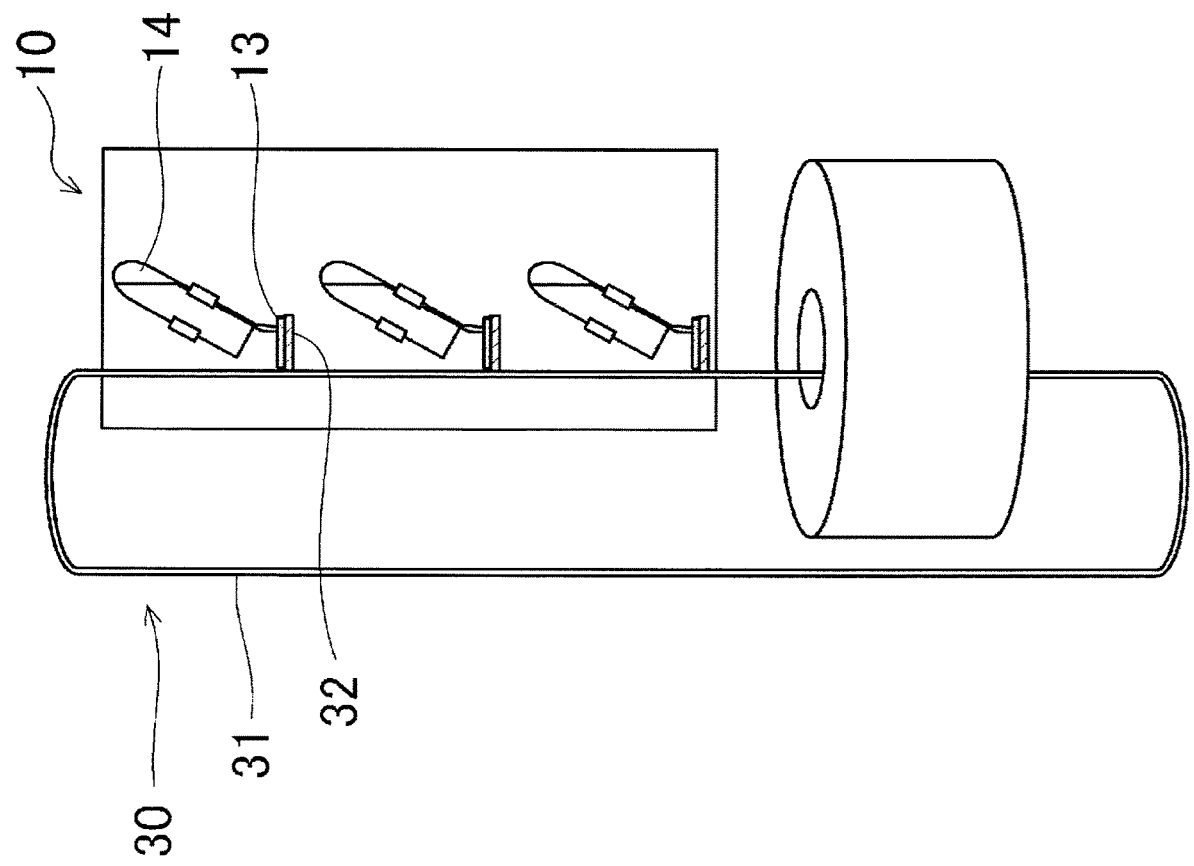
FIG. 6 is a schematic view when an operation of coating a dispersion liquid is performed by the production device shown in FIG. 4.

Next, as shown in FIG. 6, the substrate 32 is conveyed to a predetermined position under the container 12 by using the conveyor 31. Then, the mixed solution 13 which is the dispersion liquid is poured onto the substrate 32 from the container 12. At this time, the container 12 may be inclined, a lower part of the container 12 may be opened, or any other method may be used. In any case, it is preferable to provide a mesh or the like in the container 12 so that the mixing balls 14 do not fall onto the substrate 32.

Figure 7:
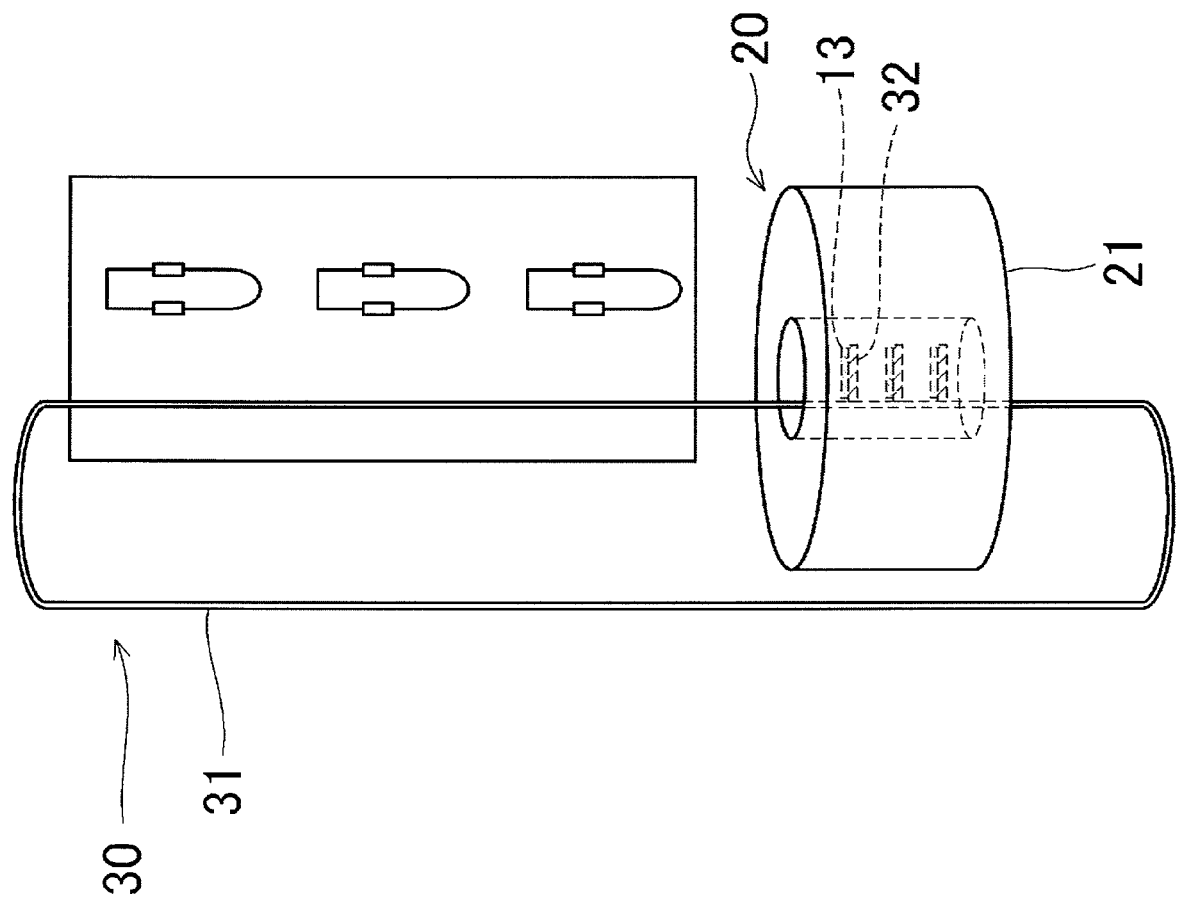
FIG. 7 is a schematic view when an operation of applying a magnetic field is performed by the production device shown in FIG. 4.

Next, as shown in FIG. 7, the substrate 32 provided with the mixed liquid 13, is set in the electromagnet 21 by using the conveyer 31. Then, the substrate 32 provided with the mixed liquid 13 which is the dispersion liquid, is placed in the magnetic field with a magnetic flux density of 2 Tesla or more, and the solvent is volatilized and solidified while orienting the ε-iron oxide in the mixed solution 13 which is the dispersion liquid.

Figure 8:
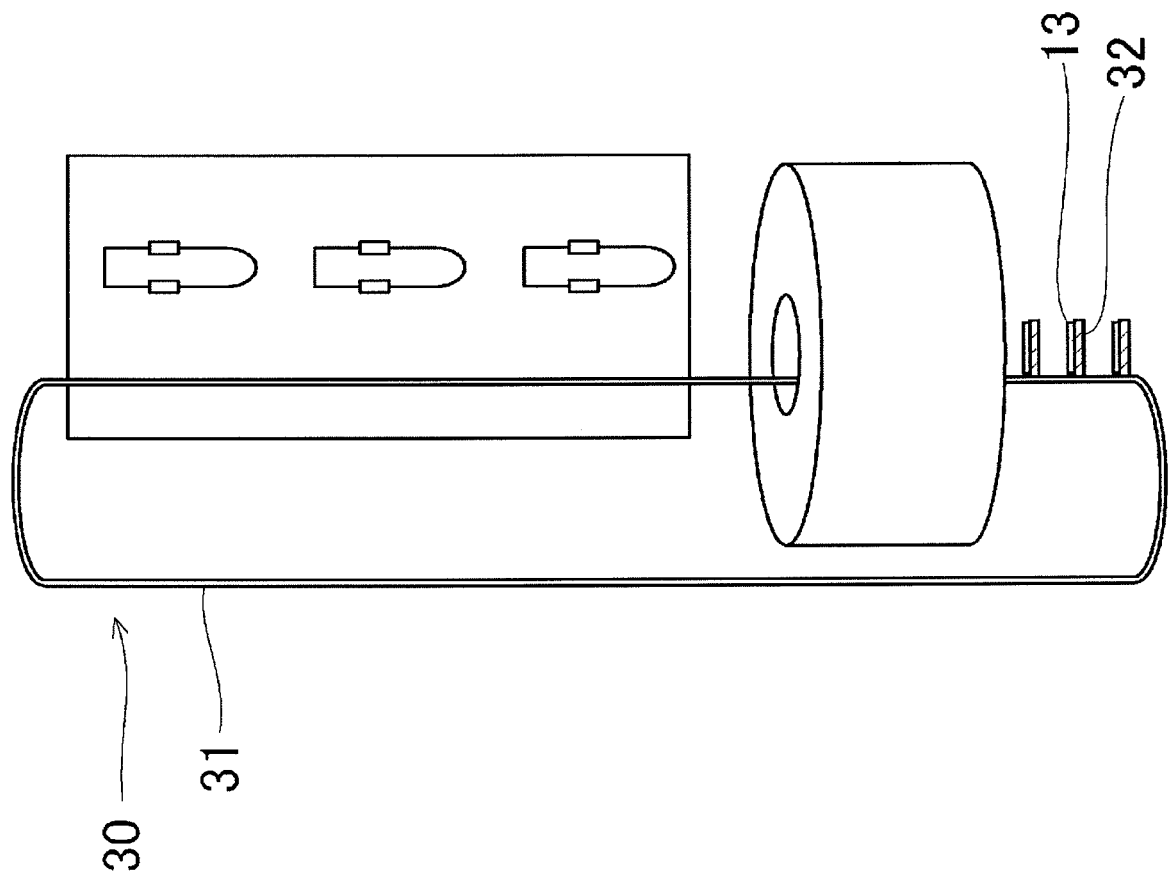
FIG. 8 is a schematic view of the oriented body of the present invention obtained by the production device shown in FIG. 4.

When the solvent in the mixed solution 13 which is the dispersion liquid is volatilized and solidified, as shown in FIG. 8, the substrate 32 having the solidified magnetic sheet may be carried out from the inside of the electromagnet 21 by using the conveyor 31.

As described above, by using the device for producing the magnetic sheet which is the oriented body containing ε-iron oxide of the present invention, the magnetic sheet which is the oriented body containing ε-iron oxide of the present invention can be produced with high uniformity and productivity.

EXAMPLES

The present invention will be more specifically described, with reference to examples hereafter.

Example 1

(1) Preparation of ε Iron Oxide Particles

ε-$Fe_2O_3$ crystal particles of Ga substitution type (satisfying x=0.45 when the molar ratio of Ga to Fe is expressed as Ga: Fe=x: (2−x)) was prepared.

<Procedure 1>

Two types of solutions were prepared: a raw material solution and a neutralizer solution.

«Preparation of a Raw Material Solution»

4153 mL of pure water, 442 g of iron nitrate (III) nonahydrate (99% purity), and 127 g of gallium (III) nitrate octahydrate (99% purity) were added to a 5 L beaker made of glass, and the solution was thoroughly stirred at room temperature, to thereby prepare a raw material solution.

At this time, in the charged composition, when the molar ratio of Ga to Fe was expressed as Ga: Fe=x : (2−x), x=0.45 is satisfied.

«Preparation of Neutralizer Solution»

374.3 g of 21.3% ammonia water was used as a neutralizer solution.

<Procedure 2>

The neutralizer solution was added dropwise to the raw material solution at a rate of about 500 mL per hour, while thoroughly stirring the raw material solution at 1,200 rpm, to thereby stir and mix both solutions and allow a neutralization reaction to occur. After the whole amount was dropped, the mixed solution was kept stirred for 30 minutes. Color of the liquid was turned into reddish brown and it was found that hydroxides of iron and gallium were generated.

<Procedure 3>

469 mL of tetraethoxysilane (corresponding to an amount of Si/(Fe +Ga)×100=150 mol% in charging ratio) was added dropwise to the mixed solution at a rate of about 125 mL per hour, while stirring the mixed solution obtained in procedure 2. Stirring was continued as it was for about one day.

<Procedure 4>

The solution obtained in procedure 3 was set in a centrifugal separator and centrifuged. A precipitate obtained in this treatment was recovered. The recovered precipitate (precursor) was washed several times with pure water.

<Procedure 5>

After the precipitate (precursor) obtained in procedure 4 was dried, the dried powder was subjected to a heat treatment at 1100 ° C. for 4 hours in a furnace inside of which was set in the air atmosphere.

<Procedure 6>

The heat-treated powder obtained in procedure 5 was stirred in a 2 mol/L NaOH aqueous solution for 24 hours, to thereby remove silicon oxide on the particle surface, which was then filtered, washed with water and dried.

By going through the above procedures 1 to 6, desired ε-iron oxide particles were obtained.

TEM average particle diameter of the obtained ε-iron oxide particles was 25.4 nm, a standard deviation was 11.1 nm, and a coefficient of variation defined by "(standard deviation/TEM average particle diameter) ×100" was 43.7%.

(2) Preparation of ε-Iron Oxide Particle Dispersion Liquid 10 mg of ε-iron oxide particles, 1.4 ml of a mixed solvent (toluene: methyl ethyl ketone=1:1), 0.5 mL of a vehicle (in which 34.9 g of a urethane resin (UR-8200 manufactured by Toyobo Co., Ltd.) and 15.8 g of vinyl chloride resin (MR-555 manufactured by Zeon Corporation) were dissolved in a mixed solvent of 0.25 g of acetylacetone, 0.25 g of n-butyl stearate and 97.9 mL of cyclohexane), and 20 g of 0.3 mmφ zirconia balls were charged in 50 mL centrifuge tube. Then, the centrifuge tube was set on a shaker, and shaking stirring was performed at 2000 shakes per minute, amplitude 3 mm, for 4 hours so that ε iron oxide particles were dispersed in the mixed solvent, to thereby obtain an ε iron oxide particle dispersion liquid.

(3) Preparation of a Magnetic Sheet Which is an Oriented Film Containing ε-Iron Oxide Particles 2 cm square glass substrate was prepared, and a polyester film (Lumirror, manufactured by Toray Industries, Inc.) was placed on the glass substrate.

About 0.03 mL of the obtained ε-iron oxide particle dispersion liquid was dropped onto the polyester film using a pipette.

The glass substrate onto which the ε-iron oxide particle dispersion liquid was dropped was allowed to stand for 36 hours while applying a magnetic flux density of 8 Tesla under a superconducting magnet, so that the mixed solvent was volatilized to cure the vehicle, to thereby prepare the magnetic sheet which is the oriented film containing ε-iron oxide particles of example 1.

(4) Magnetic Properties of the Magnetic Sheet Which is the Oriented Film Containing ε-Iron Oxide Particles Magnetic properties of the magnetic sheet which is the oriented film containing ε-iron oxide particles of example 1 will be described, with reference to the drawings.

Figure 2:
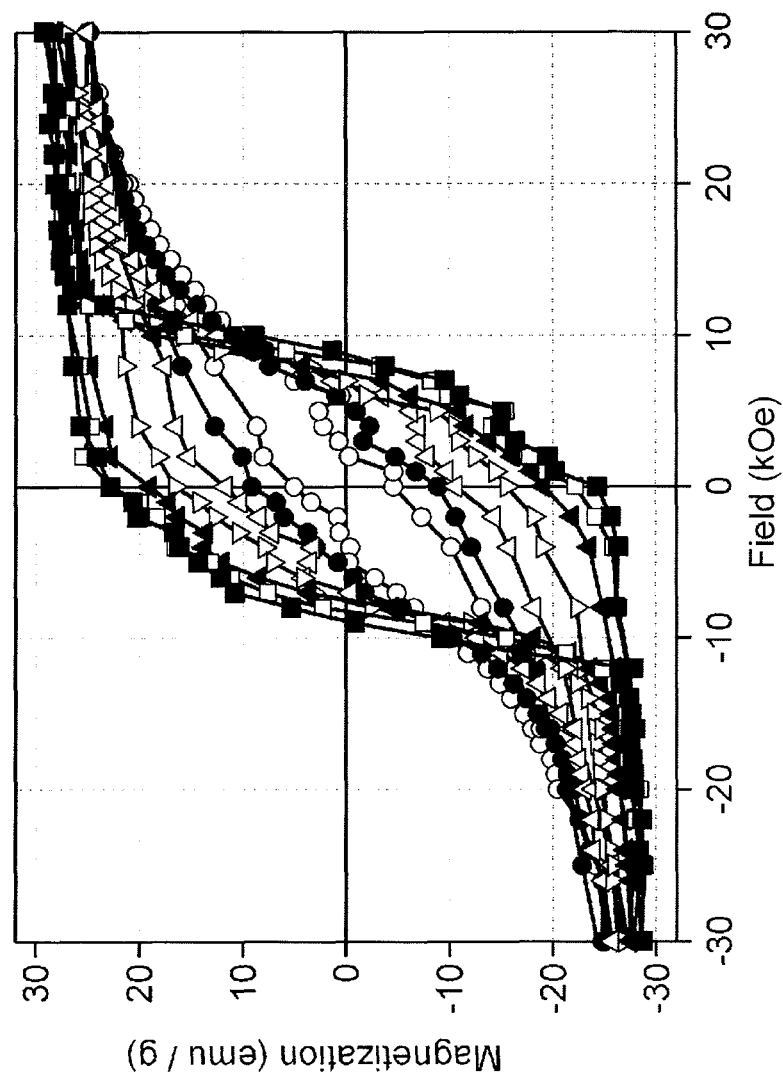
FIG. 2 is an enlarged view of the magnetization curve at ±30 kOe of FIG. 1.

FIG. 1 is a graph showing a magnetic hysteresis loop at room temperature (300 K) at 70 kOe (5.57 x $10^6$ A/m) of the magnetic sheet which is the oriented film containing ε-iron oxide particles of example 1, and FIG. 2 is an enlarged view of the graph at±30 kOe of FIG. 1.

In FIGS. 1 and 2, the results of measuring the magnetic hysteresis loop at intervals of 15 ° were shown overlappingly, in which a direction of the magnetization hard-axis was set to 0° and a direction perpendicular) (90°) thereto was set as the direction of the magnetization easy-axis.

Wherein in FIGS. 1 and 2, a loop of 0° from the direction of the magnetization hard-axis was plotted with ○, a loop of 15° therefrom was plotted with ●, a loop of 30° therefrom was plotted with △, a loop of 45° therefrom was plotted with ▽, a loop of 60° therefrom was plotted with ▲, a loop of 75° therefrom was plotted with □, and a loop of 90° (magnetization easy-axis) was plotted with ■.

For a measurement of the magnetic hysteresis loop, a superconducting quantum interference device (SQUID) magnetometer of MPMS 7 manufactured by Quantum Design Corporation was used. Then, the value of a measured magnetic moment is normalized by the mass of iron oxide.

From FIGS. 1 and 2, it is found that the oriented body containing ε-iron oxide of the present invention exerts properties unique to the ε-iron oxide.

Figure 3:
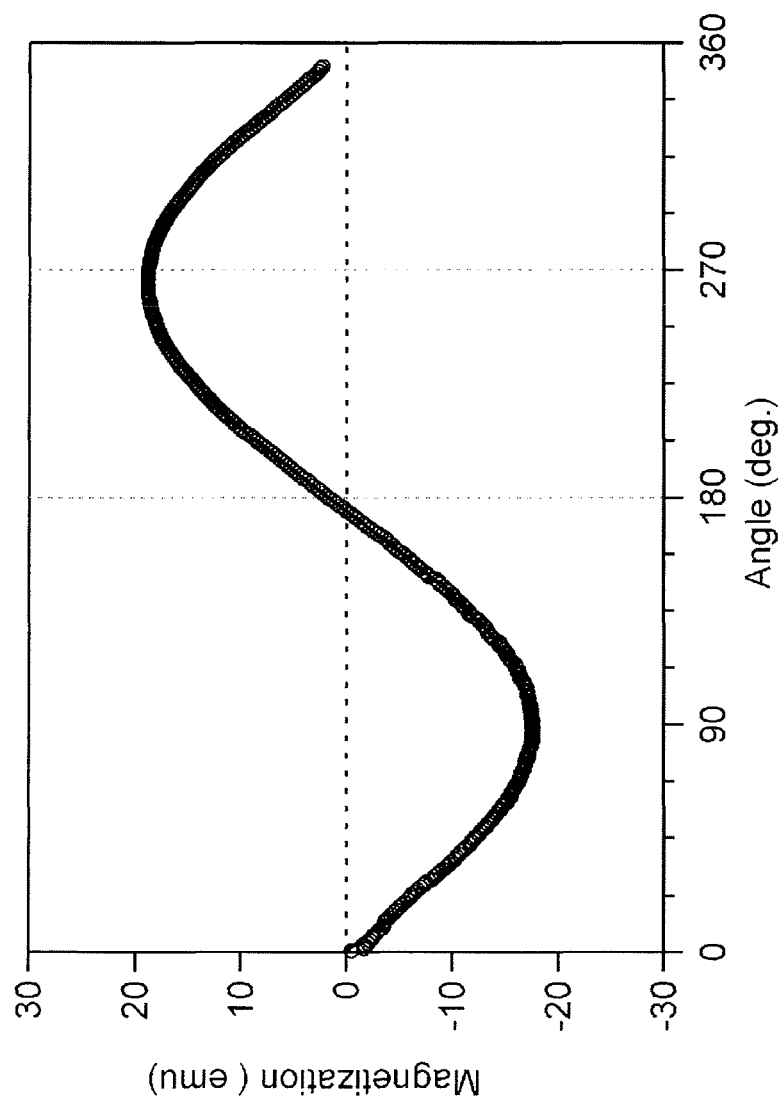
FIG. 3 is a graph showing a relationship between spontaneous magnetization and an angle of a magnetization hard-axis in the oriented body containing ε-iron oxide according to example 1.

On the other hand, FIG. 3 is a graph showing a relationship between spontaneous magnetization and an angle of the magnetization hard-axis in the magnetic sheet which is the oriented film containing ε-iron oxide particles of example 1.

From the results shown FIG. 1 to FIG. 3, the values of saturation magnetization, residual magnetization and squareness ratio (SQ) were obtained from the direction of the magnetization easy-axis to the direction of the magnetization hard-axis. The result is shown in table 1.

Then, from the result of table 1, it is found that the degree of orientation defined by "degree of orientation=SQ (direction of magnetization easy-axis)/SQ (direction of magnetization hard-axis)" is 3.5 or more, namely, 4.6, and it is conceivable that the magnetic behavior is sharp. As a result, also in the magnetic sheet which is the oriented film containing ε-iron oxide particles of example 1, improvement of magnetic recording density and improvement of Faraday effect efficiency can be expected at a level close to single crystal.

TABLE 1

| Angle (deg) | Saturation magnetization (emu/g) | Residual magnetization (emu/g) | Squareness ratio SQ |
|---|---|---|---|
| 0 (Magnetization hard-axis) | 28.7 | 4.8 | 0.17 |
| 15 | 28.8 | 9.0 | 0.31 |
| 30 | 29.1 | 11.2 | 0.38 |
| 45 | 29.2 | 16.1 | 0.55 |
| 60 | 29.4 | 19.1 | 0.65 |
| 75 | 29.8 | 22.4 | 0.75 |
| 90 (Magnetization easy-axis) | 30.1 | 23.6 | 0.78 |

From table 1, it is found that the degree of orientation = SQ (90°)/SQ (0°) = 0.78/0.17 = 4.6, wherein the value of the saturation magnetization is the value in a case of the magnetization at 70 kOe.

Example 2

In "(3) Preparation of magnetic sheet which is an oriented film containing ε-iron oxide particles" described in example 1, the magnetic sheet of example 2 was prepared in the same manner as in example 1, other than a point that the glass substrate on which the ε-iron oxide particle dispersion liquid was dropped, was allowed to stand for 36 hours while applying a magnetic flux density of 2 Tesla under a superconducting magnet, and the mixed solvent was volatilized to cure the vehicle.

Then, the magnetic properties of the magnetic sheet of example 2 were measured in the same manner as in example 1.

As a result, it was found that the degree of orientation defined by "degree of orientation=SQ (direction of magnetization easy-axis)/SQ (direction of magnetization hard-axis)" was 4.8, which was 3.5 or more, and it was conceivable that the magnetic behavior was sharp. As a result, also in the magnetic sheet which is the oriented film containing ε-iron oxide particles of example 2, improvement of magnetic recording density and improvement of Faraday effect efficiency can be expected at a level close to single crystal. The result is shown in table 2.

TABLE 2

| Angle (deg) | Saturation magnetization (emu/g) | Residual magnetization (emu/g) | Squareness ratio SQ |
|---|---|---|---|
| 0 (磁化困難軸) | 24.7 | 4.2 | 0.17 |
| 90 (磁化容易軸) | 30.0 | 24.5 | 0.82 |

From table 2, it is found that the degree of orientation = SQ (90°)/SQ (0°) = 0.82/0.17 = 4.8, wherein the value of the saturation magnetization is the value in a case of the magnetization at 70 kOe.

Comparative Example 1

(1) Preparation of ε-Iron Oxide Particles
[Procedure 1]
Two types of micelle solutions were prepared: micelle solution I and micelle solution II.
Preparation of Micelle Solution I
9 mL of pure water, 27.4 mL of n-octane and 5.4 mL of 1-butanol were put in a Teflon (registered trademark) flask. Therein, 0.0060 mol of iron (III) nitrate nonahydrate was added and dissolved by thoroughly stirring at room temperature. Further, cetyltrimethylammonium bromide as a surfactant was added and dissolved by stirring in such an amount that the molar ratio of pure water/surfactant was 35, to thereby obtain the micelle solution I.
Preparation Of Micelle Solution II
4 mL of 25% ammonia water was mixed into 2 mL of pure water and stirred, 18.3 mL of n-octane and 3.6 mL of 1-butanol were further added and the mixture was thoroughly stirred. Cetyltrimethylammonium bromide as a surfactant was added dissolved in the solution in an amount such that the molar ratio of (pure water+moisture in ammonia)/surfactant was 30, to thereby obtain the micelle solution II.
[Procedure 2]
While the micelle solution I was thoroughly stirred, the micelle solution II was added dropwise to the micelle solution I. After completion of the dropwise addition, the mixture was kept stirred for 30 minutes.
[Procedure 3]
6.0 mL of tetraethoxysilane was added to the mixture while stirring the mixed solution obtained in procedure 2. The mixture was kept stirred for one day.
[Procedure 4]
The solution obtained in procedure 3 was set in a centrifugal separator and centrifuged. The precipitate obtained in this treatment was recovered. The recovered precipitate was washed several times with a mixed solution of chloroform and methanol.
[Procedure 5]
After a precipitate obtained in procedure 4 was dried, it was subjected to a heat treatment at 1150° C. for 4 hours in a furnace in the air atmosphere.
[Procedure 6]
The heat-treated powder obtained in procedure 5 was granulated carefully with an agate mortar, and thereafter treated with 1 mol/L aqueous solution of tetramethylammonium hydroxide (N (CH$_3$)$_4$OH) for 72 hours at 70° C. to remove the silica which would be present on the particle surface. Thereafter, the solution was centrifuged at 8000 rpm using a centrifugal separator (CR21 GII, manufactured by Hitachi Koki Co., Ltd.) to obtain a precipitate comprising ε-Fe$_2$O$_3$ crystal powder. In this stage, a supernatant was cloudy, but the particles in the supernatant had a small particle size containing a large amount of superparamagnetic particles and therefore were discarded.

By this procedure 6, ε-Fe$_2$O$_3$ crystal powder was obtained.
TEM average particle diameter of the obtained ε-Fe$_2$O$_3$ crystal particles was 27.6 nm, the standard deviation of the particle diameter was 13.0 nm, the coefficient of variation calculated by [particle size standard deviation]/[TEM average particle diameter]×100 was 47.0%.
(2) Preparation of the ε-Iron Oxide Particle Dispersion Liquid
Pure water was added to the ε-Fe$_2$O$_3$ crystal powder which was then dispersed in an ultrasonic cleaner for 3 hours, to thereby obtain a colloidal solution in which particles of εE-Fe$_2$O$_3$ crystal powder were dispersed. At this time, a concentration of the ε-Fe$_2$O$_3$ crystal powder in the colloidal solution was 15 g/L.
(3) Preparation of the Magnetic Sheet Which is an Oriented Film Containing ε-Iron Oxide Particles
Tetramethoxysilane (Si (CH$_3$O)$_4$) was added to the above colloidal solution, to thereby prepare the magnetic sheet by a method of generating SiO$_2$ gel by a hydrolysis reaction with water in a magnetic field of 2 Tesla. First 0.3 mL of the colloid aqueous solution and 0.6 mL of pure water were thoroughly mixed. 0.09 mL of tetramethoxysilane was added to this solution, and the mixture was quickly stirred and poured into a container (glass petri dish). The container was set in a 2 Tesla magnetic field using a superconducting magnet and 24 hours were allowed to pass. Meanwhile, the colloid was turned into gel while receiving a magnetic field, to thereby obtain the magnetic sheet.
(4) Magnetic Properties of the Magnetic Sheet which is an Oriented Film Containing ε-Iron Oxide Particles
Magnetic properties of the obtained magnetic sheet were measured in the same manner as in example 1.
As a result, it was found that the value of the degree of orientation defined by "degree of orientation=SQ (direction of magnetization easy-axis)/SQ (direction of the magnetization hard-axis)" was 3.2, which did not reach 3.5, and also it was found that the sharpness of the magnetic behavior did not reach that of example 1.

DESCRIPTION OF SIGNS AND NUMERALS

10 Shaking part
11 Shaking device
12 Container
13 Mixed solution
14 Mixing ball
20 Magnetic field applying part
21 Electromagnet
30 Conveying part
31 Conveyor
32 Substrate

The invention claimed is:
1. An oriented body containing ε iron oxide particles as magnetic particles, wherein a degree of orientation of magnetic particles is defined by the degree of orientation=a squareness ratio (SQ) in a direction of magnetization easy-axes/a squareness ratio (SQ) in a direction of magnetization hard-axes, is more than 3.5 and no more than 4.8, and
saturation magnetization of the oriented body is from 24.7 to 30.0 emu/g.
2. An oriented body containing ε iron oxide particles as magnetic particles, wherein a degree of orientation of magnetic particles is defined by the degree of orientation=a squareness ratio (SQ) in a direction of magnetization easy-axes/a squareness ratio (SQ) in a direction of magnetization hard-axes, is more than 3.5 and no more than 4.6, and saturation magnetization of the oriented body is from 28.7 to 30.1 emu/g.

\* \* \* \* \*